United States Patent
Chang et al.

(10) Patent No.: US 7,227,218 B2
(45) Date of Patent: Jun. 5, 2007

(54) METHOD AND SYSTEM FOR FORMING SOURCE REGIONS IN MEMORY DEVICES

(75) Inventors: Yi-Shing Chang, Hsin-chu (TW); Wen-Ting Chu, Kao Hsiung (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 32 days.

(21) Appl. No.: 11/094,035

(22) Filed: Mar. 30, 2005

(65) Prior Publication Data

US 2005/0179080 A1 Aug. 18, 2005

Related U.S. Application Data

(62) Division of application No. 10/617,470, filed on Jul. 11, 2003, now Pat. No. 6,890,821.

(51) Int. Cl.
*H01L 29/788* (2006.01)

(52) U.S. Cl. ....................... 257/316; 257/317

(58) Field of Classification Search ................ 257/317
See application file for complete search history.

(56) References Cited

U.S. PATENT DOCUMENTS

| | | | |
|---|---|---|---|
| 6,057,219 A * | 5/2000 | Cho et al. | 438/597 |
| 6,346,442 B1 * | 2/2002 | Aloni et al. | 438/258 |
| 6,433,382 B1 | 8/2002 | Orlowski et al. | |
| 6,458,710 B1 * | 10/2002 | Burke | 438/713 |
| 6,541,324 B1 * | 4/2003 | Wang | 438/201 |
| 6,583,066 B2 * | 6/2003 | Aloni et al. | 438/714 |
| 6,627,946 B2 | 9/2003 | Wang | |
| 6,727,545 B2 | 4/2004 | Wang et al. | |
| 6,773,989 B2 | 8/2004 | Wang | |
| 6,933,194 B2 * | 8/2005 | Narita et al. | 438/257 |
| 2002/0137355 A1 * | 9/2002 | Burke | 438/713 |
| 2003/0139011 A1 * | 7/2003 | Cleeves et al. | 438/257 |
| 2004/0077144 A1 * | 4/2004 | Hsieh | 438/257 |

* cited by examiner

*Primary Examiner*—Stephen W. Smoot
(74) *Attorney, Agent, or Firm*—Duane Morris LLP

(57) ABSTRACT

A memory device and the method for manufacturing same is disclosed. The device comprises a first oxide layer on top of a substrate, a floating gate layer on top of the first oxide layer, a second oxide layer over the floating gate layer, wherein the second oxide layer and the floating gate layer have a first opening and a second opening respectively, and wherein the width of second opening is bigger than the width of the narrowest region of the first opening so that the floating gate layer is pulled back horizontally underneath the second oxide layer. A source region is in the substrate underneath the first oxide layer, and a third oxide layer fills in the first and second openings conforming to the contour thereof, wherein the third oxide has a third opening to reach a portion of the source region. Further, a control gate material fills in the third opening.

6 Claims, 7 Drawing Sheets

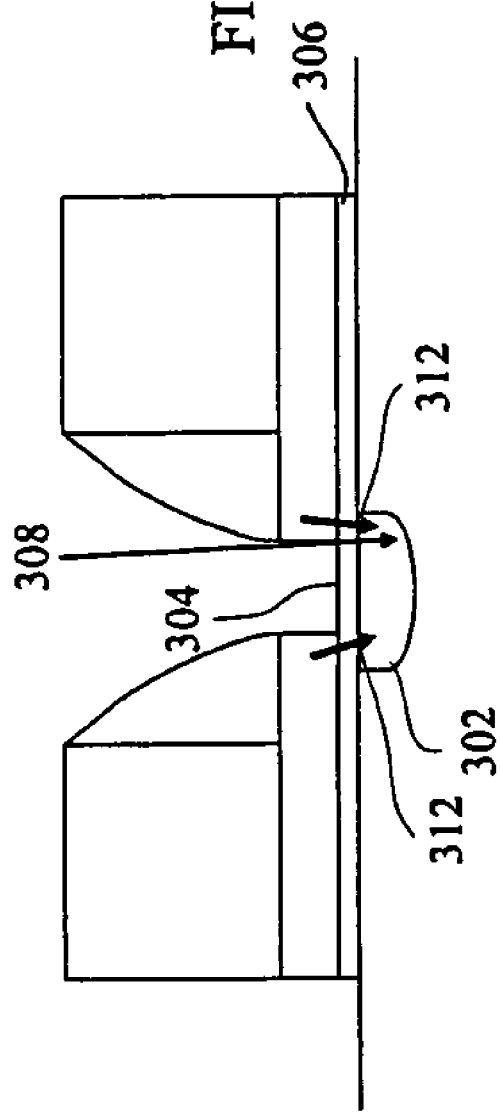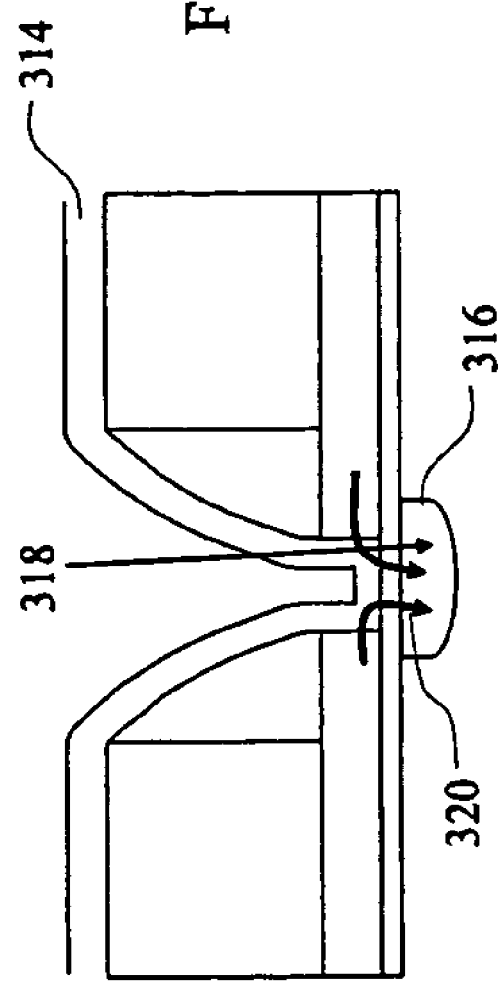

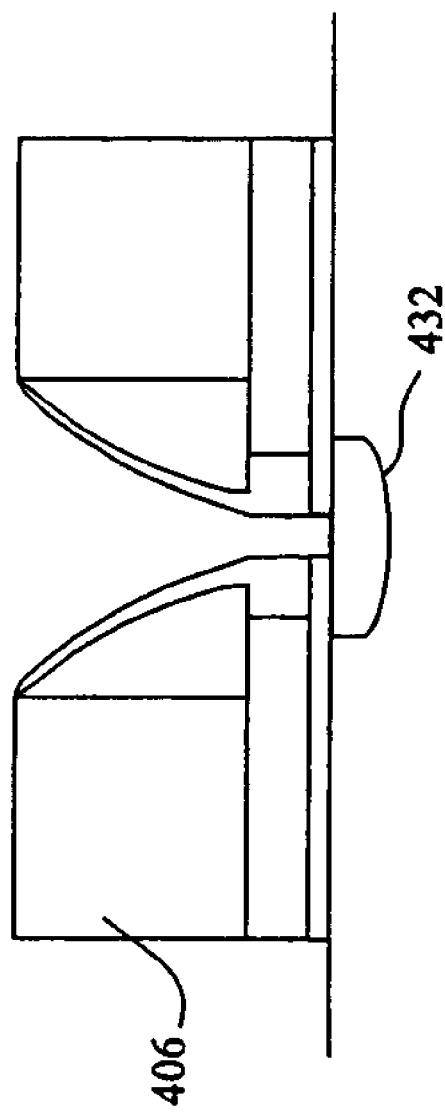
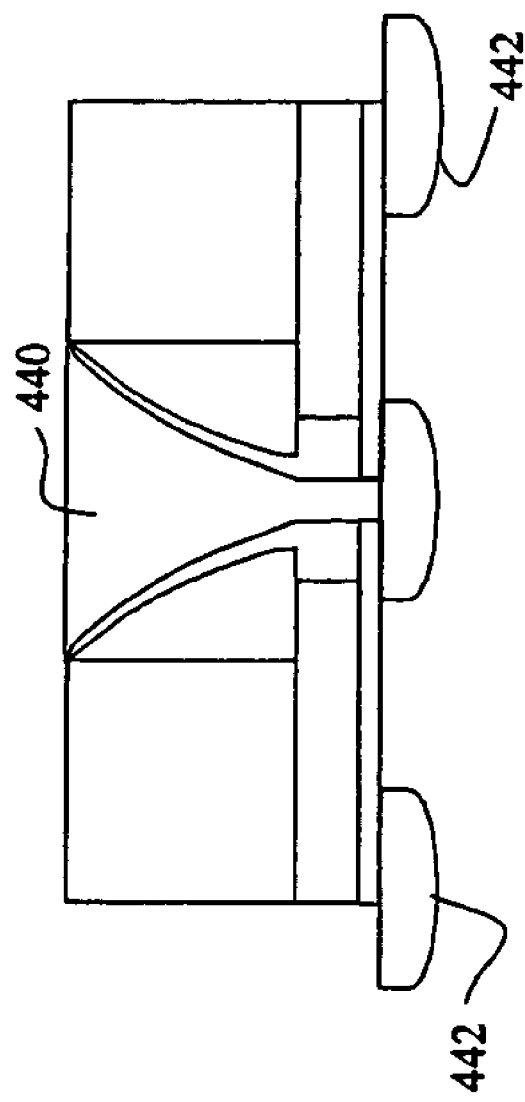

METHOD AND SYSTEM FOR FORMING SOURCE REGIONS IN MEMORY DEVICES

RELATED APPLICATIONS

This application is a divisional of U.S. patent application Ser. No. 10/617,470, filed Jul. 11, 2003 now U.S. Pat. No. 6,890,821. The entire disclosure of U.S. patent application Ser. No. 10/617,470 is incorporated herein by reference.

BACKGROUND OF THE DISCLOSURE

The present invention relates generally to semiconductor devices, and more specifically, relates to a method and system for forming source regions in memory devices.

Memory devices are widely used today for storing information for various application. Basic memory devices are typically structured in a column/row (bit-line/word-line) configuration. The data at each node may be stored and managed by a pair of transistor. One transistor might perform the function of control and the other might perform the function of data storage. One common type of memory device is a FLASH/EEPROM (Electrically Erasable and Programmable Read Only Memory). FLASH/EEPROMs can be accessed, read, written, and erased at speeds comparable to traditional RAM (Random Access Memory). They do not have the long access times of mechanical data storage (hard-media drives and soft-media drives). FLASH/EEPROMs also have an advantage in that they do not typically loose their data upon loss of power.

Typical FLASH/EEPROM fabrication processing creates structures that might have data retention problems. If the path between the floating gate (data storage) and the source is not sufficiently insulated, current leakage will occur. This current leakage will eventually reduce the potential of an "ON" floating gate, until it is no longer recognized as "ON" (i.e. the voltage has dropped below the threshold voltage).

One fabrication step in particular has been identified as a typical source of damage to the insulating oxides. This fabrication sequence occurs when the source well/region is implanted. Even with several well-known options for sequencing the ion implantation, it is difficult to avoid causing damage to the coupling oxide or the spacer oxide. The resultant damage creates leakage paths between the floating gate and source region, thereby degrading the data retention capability of the memory device.

What is needed is an efficient method for implanting the source region while not creating current leakage paths in the adjoining oxide areas.

SUMMARY OF THE DISCLOSURE

A memory device and the method for manufacturing same is disclosed. The device comprises a first oxide layer on top of a substrate, a floating gate layer on top of the first oxide layer, a second oxide layer over the floating gate layer, wherein the second oxide layer and the floating gate layer have a first opening and a second opening respectively, and wherein the width of second opening is bigger than the width of the narrowest region of the first opening so that the floating gate layer is pulled back horizontally underneath the second oxide layer. A source region is in the substrate underneath the first oxide layer, and a third oxide layer fills in the first and second openings conforming to the contour thereof, wherein the third oxide has a third opening to reach a portion of the source region. Further, a control gate material fills in the third opening.

A method is disclosed for manufacturing a memory device. A first oxide layer is formed on top of a substrate, and a gate layer is formed on top of the first oxide layer. A second oxide layer is then formed over the gate layer. A portion of the second oxide layer and the gate layer are removed to form a first opening in the second oxide layer and a second opening in the gate layer, the first and second openings exposing a portion of the first oxide underneath the gate layer, the width of second opening being bigger than the width of the narrowest region of the first opening in the second oxide layer so that the gate layer is pulled back horizontally underneath the second oxide layer. A source region is formed in the substrate underneath the first oxide layer, a third oxide layer is deposited in the first and second openings wherein the third oxide layer conforms to the contour thereof. A portion of the third oxide layer and the first oxide layer are removed to make a third opening, and a control gate material is deposited in the third opening.

BRIEF DESCRIPTION OF THE DRAWINGS

FIGS. 3a–3b illustrate conventional source implantation sequences and the resultant leakage paths.

FIGS. 4a–4f illustrate a novel fabrication-method and the resultant structure according to one example of the present disclosure.

DETAILED DESCRIPTION

Memory devices can be fabricated using combinations of well-known semiconductor process methods. At some point in the fabrication sequence, the source well/region must inevitably be doped using high-energy anisotropic implantation. When this implantation occurs, the coupling oxide or the spacer oxide is vulnerable to implant damage. The present disclosure provides a method of fabrication and a resulting structure, which protects the coupling oxide and the spacer oxide from being damaged. This disclosure uses a common FLASH/EEPROM structure as an illustration of a possible embodiment, although the fabrication method disclosed applies to all source region formation.

Figure 1:
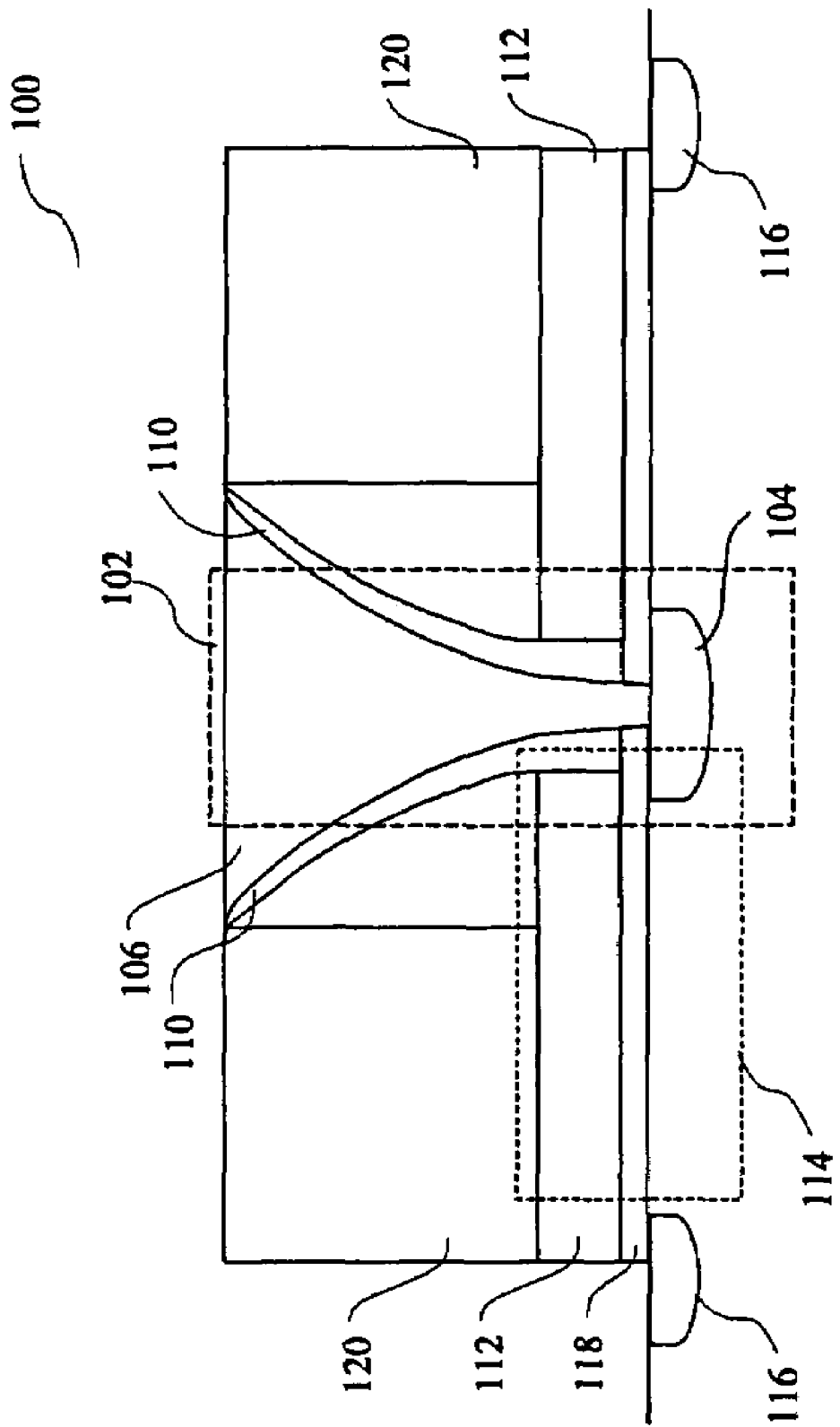
FIG. 1 illustrates a cross-section of a generic memory device structure.

FIG. 1 illustrates a cross-section view of a typical FLASH/EEPROM (100). A control transistor (102) might include a source (104), a control gate (106), a spacer oxide (110), and might use a floating gate (112) as its drain. The floating transistor (114) might include a drain (116), a coupling oxide (118), a floating gate (112), and might share a source (104) with the control transistor. A silicon nitride dielectric (120) provides an isolation barrier.

Figure 2:
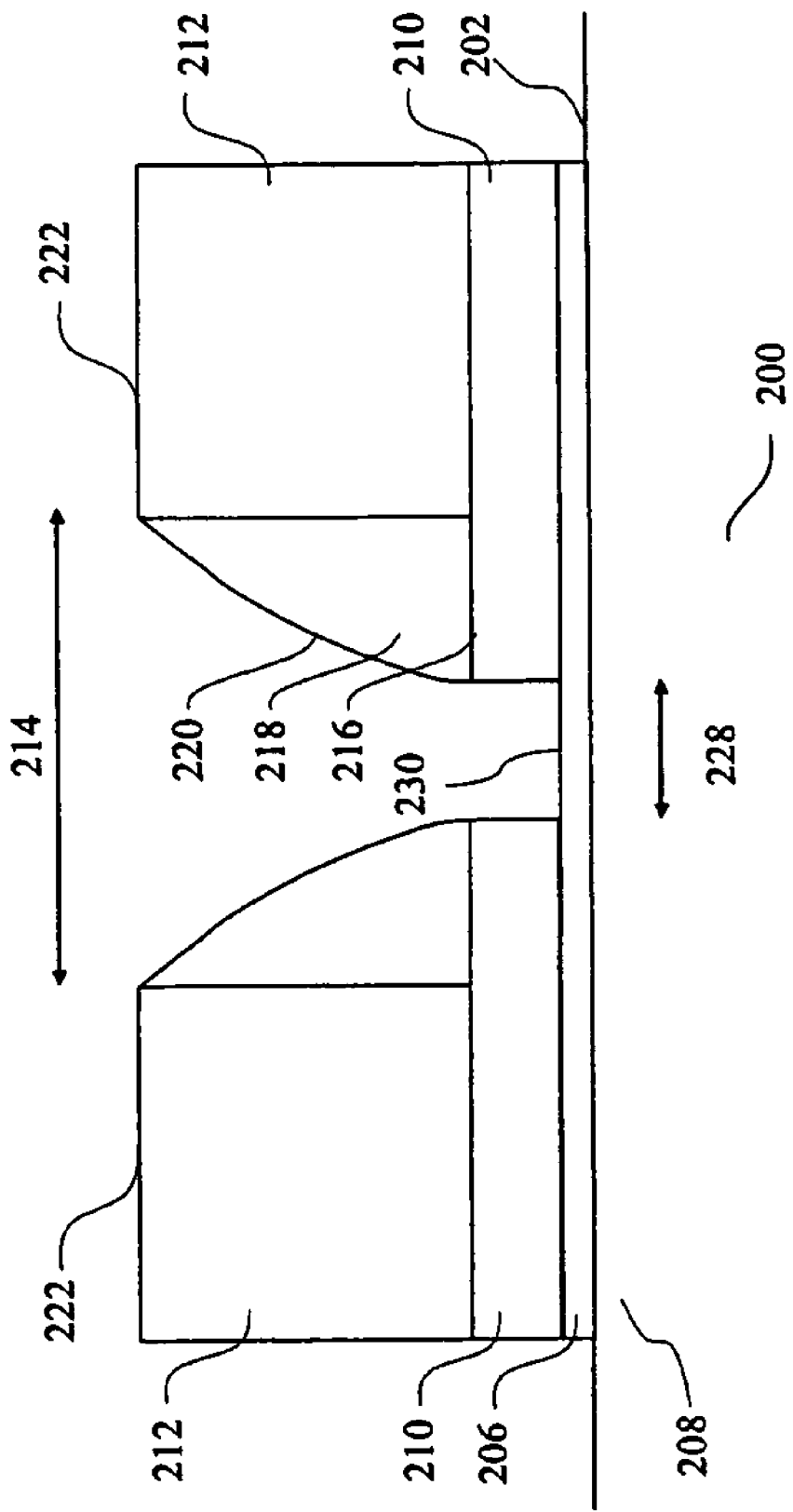
FIG. 2 illustrates a cross-section view of a memory device made from a common fabrication process.

FIG. 2 illustrates an EEPROM (200) made of a common fabrication method. The device 200 might be fabricated on a p-type silicon slice (202). It is well known, however, that devices can be fabricated on epitaxial silicon layers, or other materials and substrates. An oxide layer (206) is created upon the substrate (208). This oxide will be referred to as the coupling oxide, although it might also be referred to as the "gate oxide," or sometimes, as the "first oxide" as it is the first layer of oxide starting from the substrate. The footprint of the coupling oxide might be formed by well-known photolithographic and etching techniques. In this example, the coupling oxide will be etched after other layers have been placed. This allows the layers to be self-aligned by nature of the common etch process.

A poly-silicon film is deposited upon the coupling oxide. It will later be shaped by photolithographic methods and become floating gates (210). As with the coupling oxide, the footprint of the floating gate might be created after other layers have been placed, allowing the layers to self-align.

A silicon nitride dielectric layer (212) is deposited on the poly-silicon film. A slot (214) is etched in the silicon nitride layer, separating the silicon nitride dielectric into a plurality of dielectric barriers. The etch process uses the poly-silicon film as an etch-stop, thus exposing a section (216) of the poly-silicon floating gate (210). Growing another oxide layer, or a $2^{nd}$ oxide layer (218), on top of the entire device fills the slot (214). For illustration purposes, the 2nd oxide layer may also be referred to as a shielding oxide. The $2^{nd}$ oxide is isotropically etched with selective dry-gas etch, forming a sloped-wall slot (220) in the $2^{nd}$ oxide. The etch selectivity removes the oxide film from the top surface (222) of the silicon nitride dielectric, and exposes the poly-silicon floating gate material at the bottom of the sloped-wall slot.

The coupling oxide (206), the poly-silicon floating gate (210), the silicon nitride dielectric (212), and the $2^{nd}$ oxide (218) are now all stacked and in place. These might now be simultaneously etched and thus, "self aligned" to form floating gate transistor structures. Using one or more photolithographic and etch steps, such an anisotropic dry-gas etch, the outer perimeters of the devices are aligned, exposing the coupling oxide. A slot (228) separating the components of a device is also etched in this process, exposing (230) the coupling oxide, while not affecting the 2nd oxide (218).

Creation of the source region (302) can be accomplished at multiple points within the fabrication sequence. FIG. 3a illustrates a cross-section of the device with the center part of the substrate (304) covered only by the coupling oxide (306). It is possible to fabricate a source (302) by means of anisotropic ion implantation (308). However, if the device were subjected to ion implant at this state, parts of the coupling oxide (306) would be damaged by being exposed to high-energy ions (308). The addition of ions into these sections will reduce their dielectric strength, causing leak paths (312) from the floating gate to the source.

As illustrated in FIG. 3b, the spacer oxide (314) could be deposited prior to creating the source (316). Anisotropic ion implantation (318) could be performed through the spacer oxide (314). This process sequence, however, would damage the spacer oxide (314) by exposing it to the high-energy ions (318). Because of the proximity of the spacer oxide to the floating gate, leak paths (320) could be formed from the floating gate to the source. If implantation was completed after the final isotropic etch of the spacer oxide, the spacer oxide damage would still occur.

FIGS. 4a–4f illustrate a superior fabrication process for forming a source region of a device 400 that reduces or even eliminates ion implant damage to the spacer and coupling oxides. The new fabrication process and the resultant change in the device structure should significantly reduce leakage potential induced by the damaged coupling oxides or spacer oxides.

Figure 4A:
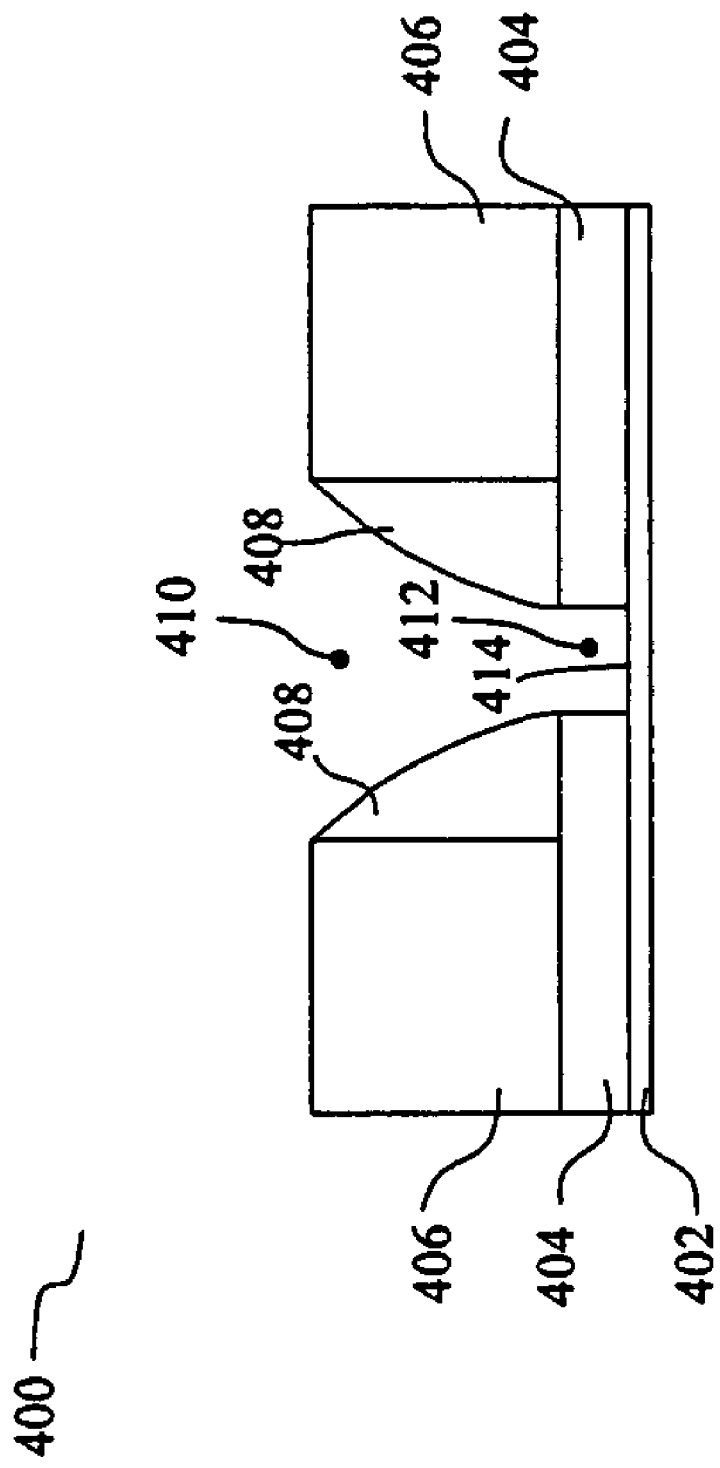

As illustrated in FIG. 4a, the disclosed process integrates steps for the formation of the coupling oxide (402), the poly-silicon floating gate (404), the silicon nitride dielectric (406), and the $2^{nd}$ oxide (408). The components illustrated in FIG. 4a have been "self aligned." This may be accomplished by a combination photolithography and etching processes, which cause these components to be etched in essentially the same vertical footprint. A first opening (410) is created in the $2^{nd}$ oxide (408). A second opening (412) is created in the floating gate (404), and is processed through the first opening (410). The etch process has also exposed a section of the coupling oxide (402). It is understood that although the first and second openings are identified separately, they can also be made in the same process as one opening having different width at the different levels of the opening.

Figure 4B:
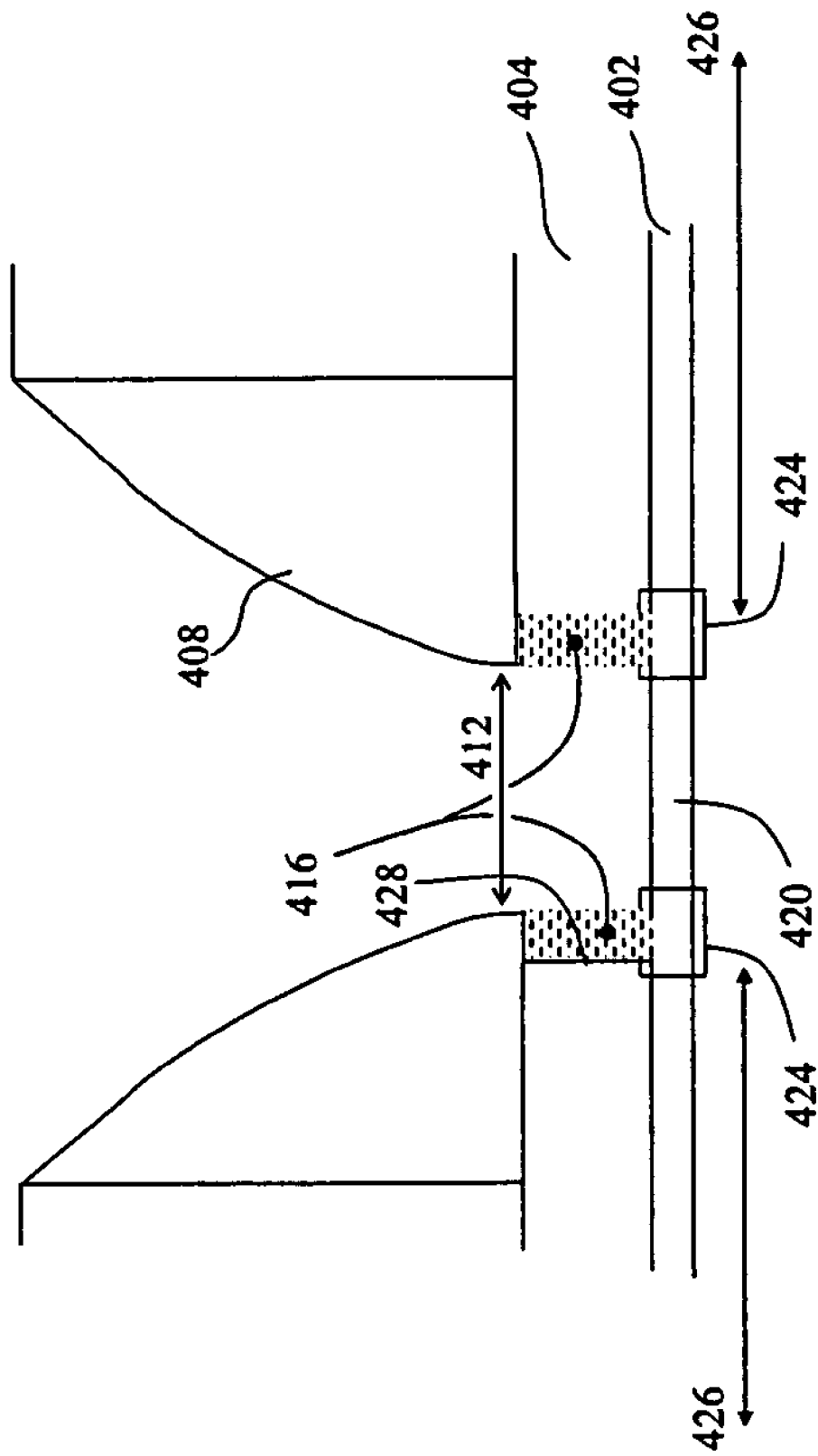

FIG. 4b illustrates the creation of pull-back regions (416) in the second opening (412). This may be accomplished with an additional etch step. Typically, this might be an isotropic dry-gas etch that might be used to pull-back or undercut the floating gate (404). The process removes a portion of the center region of the floating gate (404). A portion of the coupling oxide (402) underneath the $2^{nd}$ oxide (408) is now exposed (420). The width of the second opening 412 is wider than the narrowest region of the first opening (410) in the $2^{nd}$ oxide (408) as the floating gate (404) is pulled back horizontally underneath the $2^{nd}$ oxide (408).

By creating a pull-back (416) beneath the $2^{nd}$ oxide (408), segments (424) of the coupling oxide (402) are shielded from ion energy during anisotropic implantation. These segments (424) will eventually separate the exposed oxide (420) from the edges of the coupling oxide's effective footprint (426).

The effective footprint (426) of the coupling oxide (402) is the region aligned with, and just beneath, the leading edge (428) of the floating gate. The effective footprint of the coupling oxide 426 is also in a shadow created by the $2^{nd}$ oxide (408) so that it is not directly exposed to anisotropically directed ion energy. The section (420) of the coupling oxide (414) that is exposed to ion energy will not be proximal to the floating gate (404) and therefore will not become a potential leakage path when the device is completed.

As a result of the pullback process, the floating gate (404) and its leading edge (428) are no longer aligned with $2^{nd}$ oxide (408) and will be farther from the control gate than in a typical device. The leading edge (428) of the floating gate (404) is also farther from the edge of the second opening (412) than in a typical device. As a result also, the effective footprint of the coupling oxide (426) is farther from the narrowest region of the first opening (412).

Figure 4C:
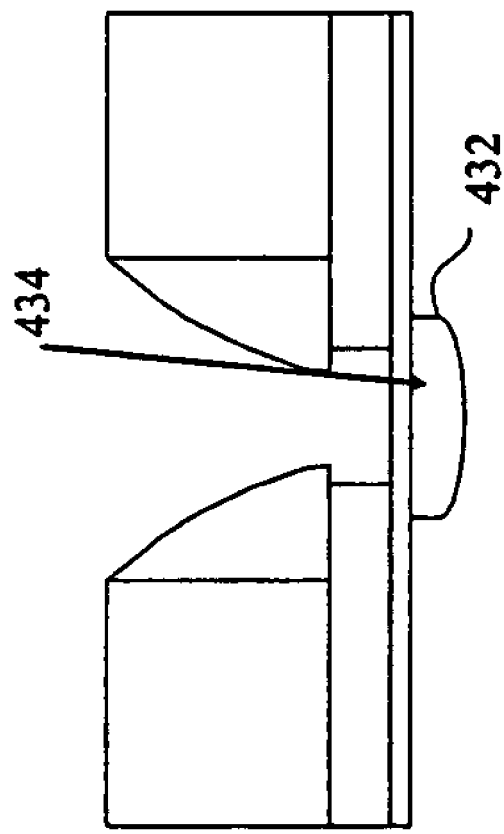

FIG. 4c illustrates the fabrication process for forming the source (432) using anisotropic ion implantation (434). The spacer oxide is not shown as it has yet to be placed. The spacer oxide will not have its dielectric strength reduced by exposure to ion energy and should not become a potential leak path.

Figure 4D:
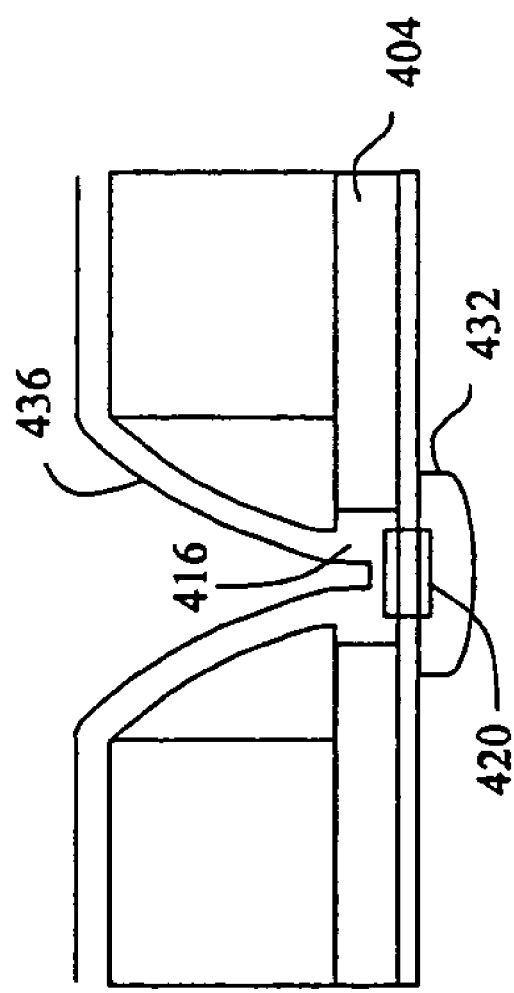

FIG. 4d illustrates that the spacer oxide (436) is conformally deposited. The oxide fills the second opening (416) that was enhanced by the pull back. This additional oxide volume adds additional isolation between the edge of the floating gate (404) and the section of coupling oxide (420), that was exposed to ion radiation. There is no longer a direct leakage path between the floating gate (404) and the source (432).

FIG. 4e illustrates an anisotropic etch process performed on the device according to one example of the present disclosure. This etch process removes the oxide from the silicon nitride dielectric (406) and exposes the source (432).

FIG. 4f illustrates how the device may further be processed by depositing a poly-silicon control gate (440), implanting drains (442), and planarizing the top surface.

The present disclosure as described above thus provides an improved method for forming source region in semiconductor devices, thereby reducing current leakage. Various benefits are achieved over conventional approaches. For instance, potential leak sites are protected by the nature of the new structure. Other potential leak sites are never exposed to damaging ion energy. For memory devices formed using the above described method, they have significantly improved data retention capability, and will therefore retain its data, in an uncorrupted form, for longer time periods.

The above disclosure provides many different embodiments, or examples, for implementing different features of the invention. Specific examples of components, and processes are described to help clarify the invention. These are, of course, merely examples and are not intended to limit the invention from that described in the claims.

While the disclosure has been particularly shown and described with reference to the preferred embodiment thereof, it will be understood by those skilled in the art that various changes in form and detail may be made therein without departing from the spirit and scope of the invention, as set forth in the following claims.

What is claimed is:

1. A flash device comprising;
   a first oxide layer on top of a substrate;
   a floating gate layer on top of the first oxide layer;
   a second oxide layer over to floating gate layer, wherein the second oxide layer and the floating gate layer have a first opening and a second opening respectively, and wherein the width of the second opening is bigger than the width of the narrowest region of the first opening so that the floating gate layer is pulled back horizontally underneath the second oxide layer and the second oxide layer overhangs the second opening;
   a source region in the substrate underneath the first oxide layer;
   a third oxide layer filled in the first and second openings conforming to the contour thereof, wherein the third oxide has a third opening to reach a portion of the source region; and
   a control gate material filling the third opening.

2. The device of claim 1 further comprising a drain region in the substrate wherein the source and drain regions, the floating gate layer, and the first oxide fraction collectively as a transistor.

3. The device of claim 1 wherein the surface of the device is smoothed by a Chemical-Mechanical Process.

4. The device of claim 1 wherein the second opening baa a substantially uniform width.

5. The device of claim 1 wherein the second opening is of a predetermined width large enough to pull back the floating gate layer to avoid damages caused by ion implantation.

6. The device of claim 1 wherein an isotropic dry-gas etching is applied to pull back the floating gate under the second oxide.

* * * * *

UNITED STATES PATENT AND TRADEMARK OFFICE
CERTIFICATE OF CORRECTION

PATENT NO.         : 7,227,218 B2                                    Page 1 of 1
APPLICATION NO. : 11/094035
DATED              : June 5, 2007
INVENTOR(S)        : Yi-Shing Chang and Wen-Ting Chu It is certified that error appears in the above-identified patent and that said Letters Patent is hereby corrected as shown below:

Column 5, line 23, delete "to" and insert therefore -- the --.

Column 6, line 13, delete "fraction" and insert therefore -- function --.

Column 6, line 17, delete "baa" and insert therefore -- has --.

Signed and Sealed this

Twenty-third Day of October, 2007

JON W. DUDAS
*Director of the United States Patent and Trademark Office*